United States Patent [19]

Yoshida et al.

[11] 4,039,114
[45] Aug. 2, 1977

[54] WIRE-BONDING EQUIPMENT

[75] Inventors: Takekazu Yoshida, Fujiidera; Yoshiaki Makizawa; Tamotsu Tanaka, both of Hirakata, all of Japan

[73] Assignee: Matsushita Electric Industrial Co., Ltd., Japan

[21] Appl. No.: 658,014

[22] Filed: Feb. 13, 1976

[30] Foreign Application Priority Data

Feb. 18, 1975   Japan ................................. 50-20509

[51] Int. Cl.$^2$ ...................... H01L 21/607; B23K 21/02
[52] U.S. Cl. ..................................... 228/1 R; 228/4.5; 228/6 A; 228/7
[58] Field of Search ................... 228/1, 179, 180, 110, 228/111, 4.5, 6 A, 7

[56] References Cited

U.S. PATENT DOCUMENTS

| 3,928,749 | 12/1975 | Hermann | 228/4.5 |
|---|---|---|---|
| 3,946,931 | 3/1976 | Bahnek | 228/180 X |

*Primary Examiner*—James L. Jones, Jr.
*Assistant Examiner*—K. J. Ramsey
*Attorney, Agent, or Firm*—Wenderoth, Lind & Ponack

[57] ABSTRACT

Wire-bonding equipment has jigs which may be secured on a mounting support whereat an electronic or other module may be loaded onto a jig and moved into a correct alignment observable on a television screen, and the jigs are transportable from the mounting support location to a positioning table location whereat successive jigs are automatically moved in a requisite manner to bring successive terminals of modules loaded thereon to a position for bonding of wires thereto by a simultaneously actuated wire-bonder unit, after which successive jigs are transported back to the mounting support to permit unloading of a wired module and loading of a new module. Since the disclosed equipment permits use of ultrasonic bonding means, and requires only simple, easily observable actions by an operator, the equipment is particularly suited to wiring of microelectronic modules.

14 Claims, 18 Drawing Figures

WIRE-BONDING EQUIPMENT

The present invention relates to a wirebonding equipment. More particularly the invention relates to equipment for automatic bonding of wiring connections of microelectronic modules or similar units.

In the field of microelectronics it is known to provide a complete circuit in a single independent unit, referred to below as a module, which is compact in size, and which may be assembled with other modules to constitute what is known as a package. Although such modules make it possible to dispense with a great number of separately provided interconnections such as are necessary in more conventional electric circuits, separate interconnection between various terminals of a module is sometimes necessary, and it is always necessary to provide separate connection means for connecting module terminals to external leads, such connection means generally being in the form of fine wires, on the order of $25\mu$ for example which are bonded to the terminals. Because of the small overall size of a module element, the distance between terminals thereof is very small, for example on the order of 1-2 mm, and only slight displacement of a connection wire results in an incorrect or imperfect connection, whereby the module is unuseable or is less reliable in use.

Figure 1:
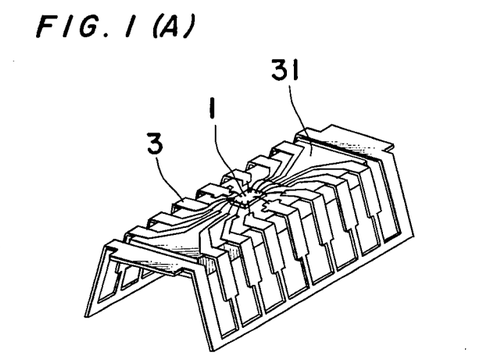

In a conventional procedure for assembly and wiring of semiconductor elements, as shown in FIG. 1 (A) and (B), a module 1, for example a dual in-line package integrated circuit, is set in a required positional relationship to an electrode pad 2 and external leads 3 and an operator while observing this assembly through a microscope or similar means, effects manual bonding of gold or aluminium wires for example in order to provide connections between terminals of the semiconductor element 1 and the external leads 3.

This work can be effected satisfactorily by skilled operators, but since the work is extremely exacting operators are subject to unusual fatigue, and it is difficult to maintain predictable standards of accuracy of wiring work, which is an obvious disadvantage in production of electronic components on an industrial scale, in addition to which rates of work are generally slow and also variable. Thus, whereas most other processes necessary to production and packaging of modules have been automated in a generally satisfactory manner, bonding of connection wires to modules is still largely dependent on the skill of operators, and in mass-production of electronic components represents a major problem in terms of quality-control and maintenance of steady production rates.

To overcome such drawbacks there have been proposed various means for effecting automatic wire-bonding. However, almost all these means are for processes involving thermocompression of gold wires, and as yet it has not been possible to provide an automatic wire-bonding means which ensures high-precision of element mounting and wire connection in a repeatable, mass-production process and also takes advantage of ultrasonic wedge bonding of wire materials other than gold.

It is accordingly an object of the present invention to provide wire-bonding equipment, which, after positioning of a semiconductor circuit, element, or other electronic module on a jig, automatically effects required wiring connections to the module, whereby improved efficiency in module production and packaging is achieved.

It is another object of the invention to provide wire-bonding equipment which permits easy and accurate initial set-up of electronic modules and easy subsequent removal thereof from the equipment.

It is a further object of the invention to provide wire-bonding equipment which permits improvement of production rates and imposes less strain on operators employed in a wire-bonding process.

In accomplishing these and other objects there is provided wire-bonding equipment comprising a plurality of jigs, for example four, which are disposed symmetrically with respect to the axis of rotation of a rotatable transport table which is actuable to carry the jigs from a module loading station to a wire-bonding station then back to the loading station. When at the loading station a jig is disengaged from the transport table and held on a fixed mounting support. The hand of an operator setting a module on a jig at the loading station prevents impingement of light on a photodetector element which thereupoon actuates a relay means. The construction of the jig and mounting support is such that when this relay means is actuated the jig head, which actually carries the module and which is viewable at a suitable magnification on a television screen marked with cross-linked or other suitable alignment marks, may be moved slightly with respect to the jig body, while the jig body is held in fixed attachment to the mounting support. The operator therefore, while observing the television screen, moves the jig head into a position in which the module placed and held thereon is in matching alignment with the reference marks on the television screen. When alignment is achieved and the operator's hand is removed the relay means controlled by the photodetector element is de-energized, with the result that the jig head, now carrying the module is a required alignment, is fixedly held to the jig body, and the jig body, while still supported on the mouting support, is not fixedly held thereon. The jig head remains fixedly held on the jig body until completion of wire-bonding and subsequent removal of the module when the jig is returned to the loading station and the operator's hand again causes actuation of the relay means. The invention thus offers the first advantage that initial set-up and alignment of successive modules to be wired is effected very simply, removal of modules also being rapidly achieved.

When loading of the module is completed the rotary transport table is actuated, whereby the newly loaded jig is carried to an intermediate position, a jig carrying a previously loaded module is carried to the wire-bonding station and a jig carrying a module in which wiring has been completed is carried to the loading station, whereat the wired module may be removed and a new module loaded. The jig brought to the wire-bonding station is set onto a positioning plate to which the jig may be fixedly held in the same manner as to the mounting support at the loading station, whereby the module alignment achieved at the loading station is also maintained at the wire-bonding station. The positioning plate may be displaced short distances in requisite directions to bring successive terminals of the module into position for bonding thereto of connection wires by a wire-bonding unit comprising an ultrasonic wedge and wire feed means, movement of the positioning plate means and synchronized actuation of the wire-bonding unit being controlled by a suitably programmed numeric control unit or similar means, and the wire-bonding process being observable by means of a suitably located microscope, whereby an operator will known when the wire-bonding process is completed and when the rotary transport table should again be actuated. While the wire-bonding process is being effected, a previous module is unloaded from a new module is loaded onto the jig currently at the loading station, as noted above. The time required at the wire-bonding station to bond wires to an light-terminal module, for example, and the average time required to unload a module and load a new module in correct alignment on a jig at the loading station are such that it is possible for an operator to control three wire-bonding units.

It will be noted that the principal action required of an operator is alignment of a module on a jig at the loading station, and that this work is done while observing a television screen, which may be sufficiently large to permit easy viewing of the module thereby avoiding problems of fatigue of the operator. Also, since the process at the wire-bonding station is entirely automatic, there is no problem of variation of accuracy on wire attachment. With the equipment of the invention therefore wire-bonding of electronic modules may proceed accurately on a mass-production scale, production rates may be calculated and maintained, and the load on the operators lessened.

A better understanding of the present invention may be had from the following full description of one preferred embodiment thereof when read in reference to the attached drawings in which like numbers refer to like parts, and in which:

FIG. 1 (A) is a perspective view showing the interior of a wired dual in-line package integrated circuit referred to in the foregoing description;

FIG. 1 (B) is an enlarged perspective view of the wired portion of the circuit of FIG. 1;

FIGS. 8 (A) and 8 (B) are respectively plan and vertical cross-sectional views of a rotary jig transport means;

FIGS. 9 (A) and 9 (B) are respectively plan and vertical cross-sectional views of a positioning means at a wire-bonding station;

FIGS. 10 (A) and 10 (B) are respectively plan and vertical cross-sectional view showing constructional details of the upper portion of the positioning means of FIGS. 9A and 9B;

Figure 2:
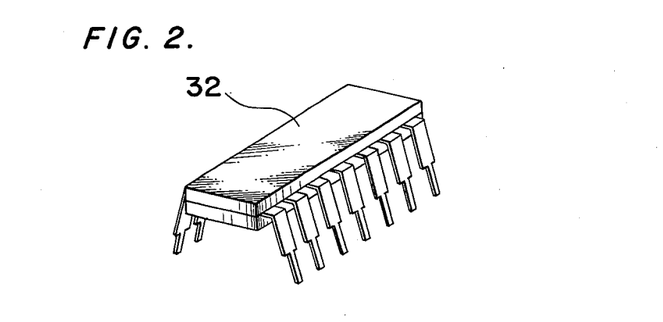
FIG. 2 is a perspective view showing the final external appearance of a product wired by means of the equipment of the invention.

The description below presumes that modules to be wired are dual in-line package integrated circuits requiring to have effected wiring connections such as shown in FIG. 1, and having, subsequent to completion of wiring, the general external appearance shown in FIG. 2, it being understood that the equipment of the invention is equally employable for wiring of other types of modules.

Figure 3:
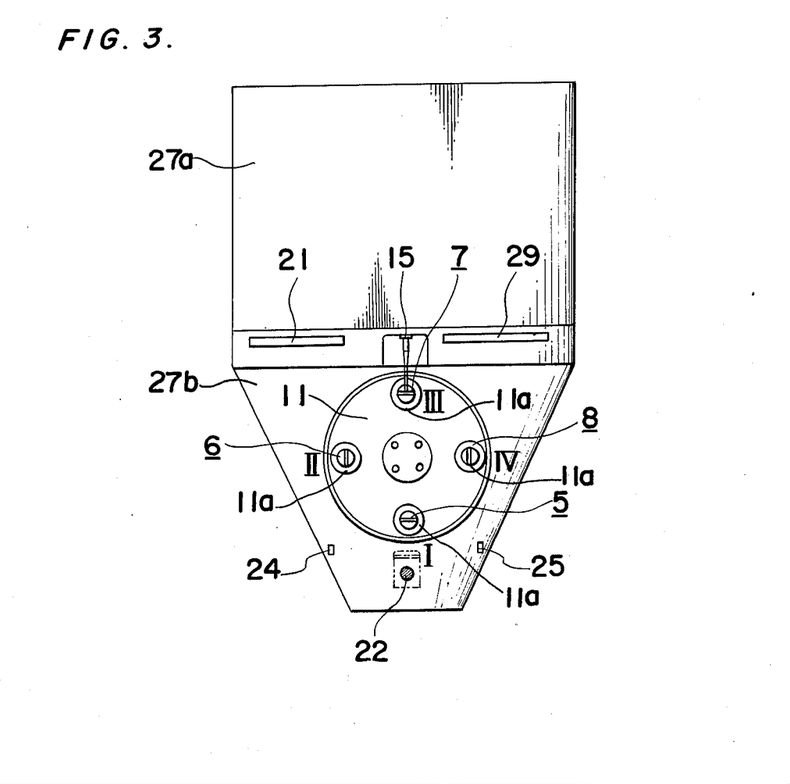
FIG. 3 is a view of the wire bonding equipment according to the invention.
Figure 4:
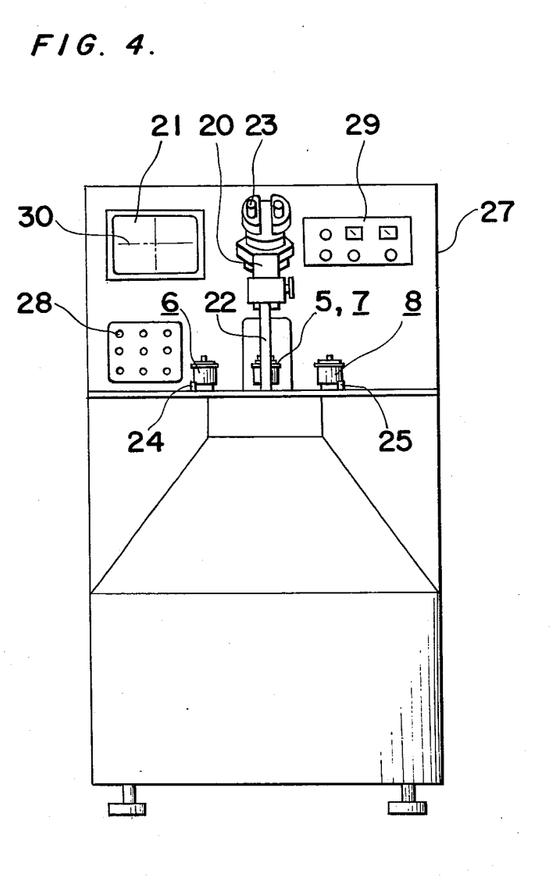
FIGS. 4 and 5 are respectively front and side sectional views of the equipment.

Referring to FIGS. 3 and 4, there is shown wire-bonding equipment comprising a main support base 27 and housing 27a and a forwardly extending working table unit 27b, i.e. the working table unit extends towards an operator positioned to actuate the wire-bonding equipment. On the working table unit 27a there is provided a circular rotary transport table 11. Near peripheral portions of the transport table 11 there are formed four circular openings 11a, which are disposed symmetrically and at an equal distance from the rotational axis of the table 11. Through each hole 11a passes a jig 5, 6, 7, or 8, which are identical, and on each of which an electronic module may be mounted and held in a requisite alignment as described in greater detail below. The rotary transport table 11 is driven by a drive unit 12 which is actuated by depression of a spring-back push-button 28 actuable by an operator. Each time the push-button 28 is depressed the transport table 11 is turned 90°, clockwise as seen in FIG. 3, and then stopped, the jigs 5 through 8 being carried in circular motion by the transport table 11 during this movement of the table 11. Thus, upon repeated actuation of the transport table 11, successive jigs 5 through 8 are carried from a loading station I, which is nearest to an operator, to a first intermediate position II, to a wire-bonding station III, whereat requisite wiring of a module carried on a jig is effected, to a second intermediate position IV, and then back to the loading station I.

Figure 5:
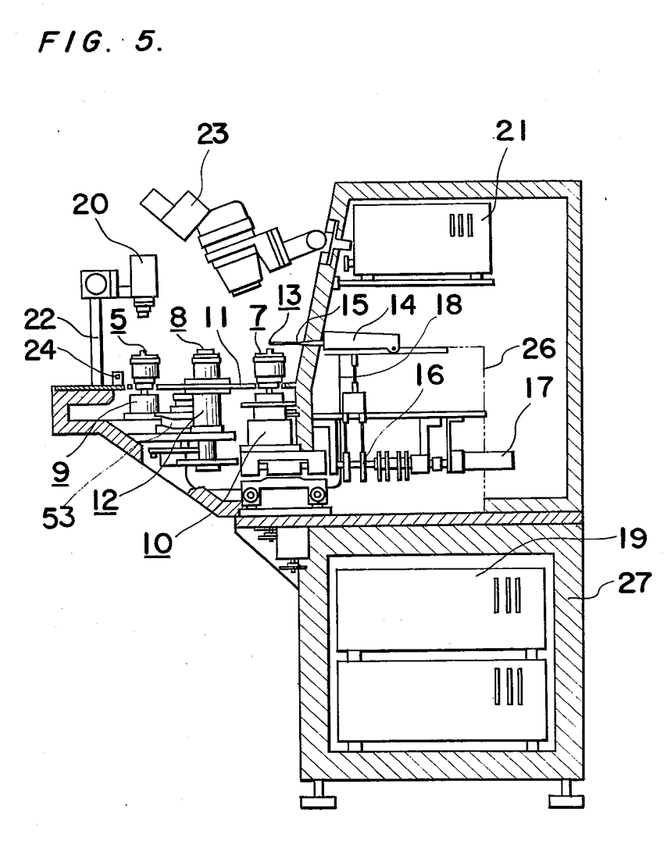

Still referring to FIGS. 3 and 4, and also referring to FIG. 5, above the loading station I there is provided a television camera 20, which is supported on a vertical post 22 fixedly attached to the working table unit 27b, and which projects the image of an electronic module placed on the head of jig at the loading station I, jig 5 in the drawings, onto a monitor screen 21 located at an upper forward portion of the main housing unit 27a and viewable by an operator. The screen 21 is marked with cross-lines 31, or similar alignment marks. On each module, not shown, there are provided witness marks, for example, which when the module is loaded on the jig 5 at the loading station I may be brought into alignment with the cross-lines 31 on the screen 21 by adjustment by the operator of the position of the jig head of the jig 5, the operator knowing that the module is in a correct setting for subsequent wiring thereof when this alignment is achieved.

Positioned above the wire-bonding station III there is provided a microscope 23, which is supported in a suitable manner on the forward portion of the main housing unit 27a, via which the operator may observe the process of bonding of wires to terminals of a module positioned on the jig currently at the wire-bonding station III, jig 7 in the drawings, and which permits the operator to know when the wire-bonding process is completed. The wire-bonding process is effected by ultrasonic waves directed through a horn 15 which extends forwards from the main housing unit 27a and has an outer tip positioned above a generally central, reference point of the wire-bonding station III, and forms part of a wire bonding unit, described in greater detail below, which is contained principally in an internal housing 26, and which is actuated on successive occasions to effect wiring of successive modules brought to the wire-boning station III by successive actuation of a control switch 29 by the operator.

As shown most clearly in FIG. 3, near the outer end of the working table unit 27b and generally in line with the loading station I there is provided a photodetector element 24 and a light source 25 constantly actuated to emit light which impinge on the photodetector element 24, the element 24 and light source 25 being preferably provided on opposite sides of the loading station I. The photodetector element 24, which may be a conventionally known means either presenting a resistance or producing a current whch varies according to the intensity of light thereon, forms part of a control circuit of a first vacuum-producing unit, now shown, which is connectable to elements at the loading station I in a manner described below. The control circuit of the first vacuum-producing unit is so formed that the first vacuum-producing unit remains unactuated when the photodetector element 24 receives light from the light source 25, and is actuated when light from source 25 is prevented from reaching element 24. The sensitivity of the photodetector element 24 is suitably made such tat the element 24 is actuable as a control circuit element only by light from light source 25, and element 24 may be provided with protection from other light and light source 25 with a reflector or other light-direction means. When an operator is placing or removing a module onto or from jig 5 at loading station I, either element 24 or source 25, or both are covered by one hand or the two hands of the operator, with the result that the first vacuum-producing unit is actuated.

Referring to FIG. 5, the rotary transport table 11 is driveable by a drive unit 12 provided in a lower portion of the working table unit 27b. The jig 5 at the loading station I is supported on a fixed mounting support 9. The Jig 7 at the wire-bonding station III is supported on a positioning unit 10, which may be rotated or moved along mutually orthogonal axes, such movement of the unit 10 being in a horizontal plane, whereby different terminals of a module carried by the jig 7 supported on the positioning unit 10 are brought to a position directly below a wire-bonder 13 which receives ultrasonic waves emitted by transducer 14 and transmitted by the horn 15, the positioning unit 10 being held stationary while bonding of a wire is actually proceeding. the wire-bonder 13 and horn 15 are lowered to a horizontal or slightly downwardly inclined position when bonding is actually in process, and are raised while the positioning unit 10 is actuated and is moving to bring another terminal of a module on the jig 7 into a position for wiring, this raising and lowering being effected by a cam unit 16 which acts through a rod 18 connecting to the wire-bonder unit and is mounted on a shaft driven by a pulse motor 17. Subsequent to actuation of the abovementioned control switch 29, action of the motor 17, and hence lowering and raising of the wire-bonder unit, action of the transducer 14, and movement of the positioning unit 10 requisite distances in requisite directions are all controlled by a numeric control unit 19 accommodated in the main support base 27.

Figure 6:
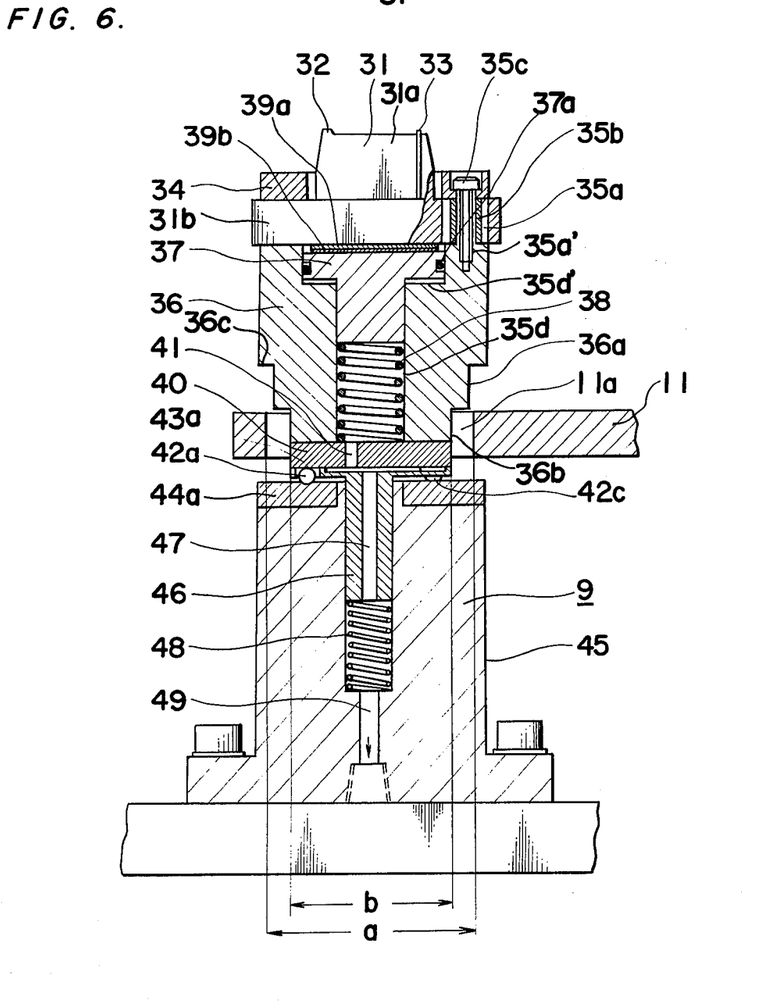
FIG. 6 is an enlarged vertical cross-sectional view of a jig and mounting support in the equipment.

Referring now to FIG. 6, which shows a jig mounted on the mounting support 9 at the loading station I, each jig 5 through 8 has a generally cylindrical shape and comprises a main body portion 36 which has an uppermost large diameter portion, an intermediate, smaller diameter portion 36a, the diameter of which is generally equal to the diameter a of a hole 11a formed near the periphery of the transport table 11, and a lowermost portion 36b which has a still smaller diameter b. When unactuated, the transport table 11 is generally level with the jig lowermost portion 36b, whereby the jig is not contacted by the table 11 and is free to rest on the mounting support 9. When actuated in a manner described below, prior to turning 90°, the table 11 is first raised and moved into line with the jig intermediate portion 36a and the upper surface portions of the table II which surround the hole 11a are brought into contact with the jig wall portion 36c which joins the jig uppermost portion and the jig intermediate portion 36a, the table 11 being raised to a height such that the jig is lifted clear of the support mount 9 by the table 11. At the same time of course the table 11 is brought into similar contact with the other jigs, and subsequent rotation of the table 11 carries each jig through the quandrant of a circle, as noted above, after which the table 11 is again lowered to its normal, unactuated position.

Figure 7:
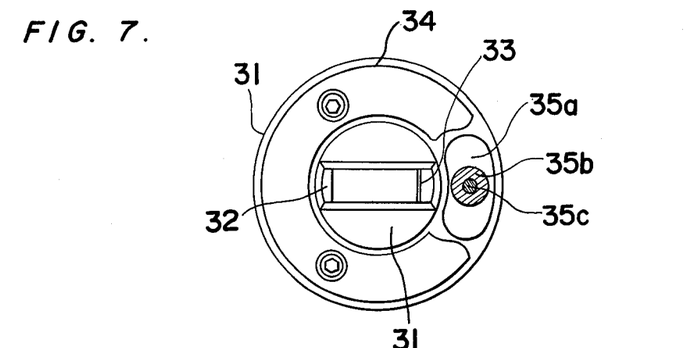
FIG. 7 is a plan view of a jig.

In FIGS. 6 and 7, the jig also comprises a head 31 comprising an upwardly extending module carrier portion 31a which is of suitable size for carrying a module and extends upwards from a generally central portion of, and is fixedly attached to a collar 31b which has a diameter generally equal to or slightly greater than that of the uppermost portion of the jig main body 36, and is in flat slidable contact therewith. The top surface of the module carrier portion 31a has a flat surface between a projection stop 32 and retainer spring element 33. A module to be wired is placed on this flat surface and is held in place by the projection 32 and spring element 33. Once positioned in this manner, the module is not moveable relative to the jig head 31.

Placed on the collar 31b there is a top plate 34 which has a generally central open portion slightly larger than the module carrier portion 31a of the head 31 and surrounds the module carrier portion 31a. The top plate 34 is attached to the collar 31b and to the jig main body 36 by three symmetrically disposed bolts 35c extending through holes 35a which are formed in the collar 31b, and each of which is slightly larger in diameter than a bolt 35c, and has provided therein a spacer or spacers 35b, and into holes 35a which are formed in the upper portion of the jig main body 36 and each of which has a diameter matching that of a bolt 35c. The top plate 34 is thus in fixed attachment to the jig main body 36, the attachment means but permits slight movement of the jig head 31 in various directions relative to the jig main body 36, the amount of this movement depending on the size of the holes 35a relative to the bolts 35c, the thickness of the spacers 35b and the size of the central opening of the top plate 34. The size of the plate 34 central opening is however, preferably made such that it constitutes no limitation on the movement of the jig head 31. The thickness of the collar 31b is such that although the jig head 31 may be moved by applied pressure in a manner described below, friction between the colar 31b and the top plate 34 and jig main body 36 is sufficient to constitute a constraint to movement of the jig head 31 unless such pressure is positively applied.

Movement of the jig head 31 relative to the top plate 34 and jig main body 36 is normally completely prevented by a vertically aligned piston 37 slidably mounted in a central, cylindrical opening 36d which is provided in the jig main body 36 and having a piston head which is fitted with a piston ring 37a and which can exert pressure on the lower surface of the jig head collar 31b through contact plates 39a and 39b made of hard rubber, for example, and which can also contact an inner wall portion 36d' of the central opening 36d and thereby exert downward pressure on the jig main body 36. The piston 37 is normally urged upwards to press against the jig head collar 31b with sufficient force to prevent movement of the jig head 31 relative to the jig main body by an expansion spring 38 also provided in the jig main body central opening 36d and having an upper end pressing against the lower end of the piston 37 and a lower end pressing against a bottom plate 40 which is provided in fixed airtight attachment to, and extends across the entire bottom surface of the jig main body 36. In the bottom plate 40 there is formed an air passage 41 which permits communication between the jig main body central opening 36d and the abovementioned 1st vacuum-producing unit in a manner described below.

In the lower surface of the bottom plate 40 there are formed three cavities 43a, 43b and 43c, which are suitably out of line with a symmetrically disposed with respect to the jig main body central opening 36d, and into which fit the upper portions of balls 42a, 42b, and 42c which are made of a suitably rigid material such as steel, and which have the same configuration, and the same dimensions, as the holes 43a, 43b and 43c, and are fixedly seated in and project above cavities 44a, 44b and 44c formed in the upper surface of a cover plate 44 fixedly attached to the main a body 45 of the mounting support 9. Thus the cavities 43a, 43b, and 43c in the bottom plate 40 of the jig main body 36 fit exactly over the balls 42a, 42b and 42c, whereby, since all jigs 5 through 8 have an identical construction, a jig supported on the mounting support 9 is held in a precise positional relationship to the equipment as a whole. The jig is maintained in the same general alignment during transport thereof by the transport table 11, since during this transport the opening 11a of the transport plate 11 fits exactly or closely around the intermediate portion 36a of the jig as noted above. The positioning unit 10 at the wire-bonding station III is also provided with three fixed balls 42d, 42e, and 42f of the same size and in the same configuration as the steel balls 42a, 42b and 42c on the mounting support 9, whereby when a jig brought to the wire-bonding station III is lowered onto the positioning unit 10, the jig may be brought into the same alignment as that in which it was while on the mounting support 9, even if there is a slight displacement from this alignment during transport thereof by the transport table 11.

Still referring to FIG. 6, in the central portion of the main body 45 of the mounting support 9 there is formed a vertically aligned passage 49 extending completely through the main body 45 and having a large-diameter upper portion, a small-diameter intermediate portion and a lowermost flared portion. The uppermost portion of the passage 49 accommodates a piston which is slidable without play in the passage 49, which has a head projecting slightly above the upper surface of the cover plate 44 of the mounting support 9 having peripheral portions which may fit smoothly against the bottom plate 40, and which is loaded by a restoring spring 48 the upper end of which is in contact with the lower end of the piston 46 and the lower end of which is supported on the wall portion of the passage 49 which connects the upper portion and the intermediate portion of the passage 49. The piston 46 has a central air passage 47 which extends completely therethrough and provides communication between the passage 49 in the support 9 and, via the opening 41 in the bottom plate 40 of the jig main body 36, with the passage 36d in the jig main body 36. The lowermost portion of the passage 49 communicates with the 1st vacuum-producing unit. Actuation of the 1st vacuum-producing unit therefore produces a vacuum in the passage 36d and 49 which causes the pistons 37 and 46 to be moved downwards against the force of the springs 38 and 48. As a result of this downward movement of the piston 37 the jig main body 36 is held firmly against the mounting support 9, while at the same time pressure by the piston 37 to prevent movement of the jig head 31 relative to the jig main body 36 is removed. Thus, since the photodetector element 24 (FIG. 3) is actuated and causes actuation of the 1st vacuum-producing unit when an operator places a module on the jig head 31, the operator may at this time move the jig head 31 as necessary to bring the module mounted thereon into exact alignment with the crosslines 31 on the television screen 21 (FIG. 4). To facilitate this movement, it is most suitable that the collar 31b of the jig head 31 have a diameter somewhat larger than that of the jig main body 36, whereby the operator can easily apply pressure to different portions of the periphery of the collar 31b.

It is of course possible to provide conventionally known screw adjustment means for adjusting the setting of the jig head 31 in a required manner, but in addition to the equipment being made complex and less compact by the provision of such means, adjustment by such means is known to be time-consuming, and it is believed that a much greater advantage is offered by the abovedescribed means of the invention, which permits direct and rapid adjustment of the setting of a module.

When the operator ceases to apply pressure to move the jig head 31, the jig head 31 remains in its set position since the collar 31b is in horizontal alignment and is also in frictional contact with the top plate 34 and jig main body 36. When the hands of the operator move away from the jig, light from light source 25 is again allowed to impinge on photodetector element 24, whereupon actuation of the 1st vacuum-producing unit is terminated and the springs 38 and 48 are therefore allowed to move the pistons 37 and 46 upwards again, the spring 48 returning the piston 46 to a level slightly above the top of the mounting support 9 but not causing the piston 46 to apply great pressure on the bottom of the jig mounted on the support 9, and pressure of the spring 38 causing the piston 37 to press the collar 31b of the jig head 31 firmly against the top plate 34, whereby the jig head 31 is securely held in its set alignment, and also to release the downwared pressure applied on the jig main body 36, whereby the jig, although still maintained in position on the mounting support 9 by the balls 42a, 42b and 42c, may be lifted freely from the support 9.

When loading of a module on the jig at the loading station I is thus completed, presuming wiring of a module at the wire-bonding station III is not in progress, the operator presses push-button 28 (FIG. 4) to actuate the rotary transport table 11.

Referring now to FIGS. 8A and 8B, which show details of the drive unit 12 of the transport table 11, the central portion of the transport table 11 is fitted with fixedly attached upper and lower plates 11b and 11c and is splined onto the upper portion of a drive shaft 55, the table 11 thus being slidable on the shaft 55 and moveable to an upper position and a lower position, but being compelled to rotate with the shaft 55. The lower plate 11c fixedly attached to the central portion of the transport table 11 has a central opening which is either in splined connection with, or permits free rotation of the shaft 55, whereas the upper plate 11b is a solid element which contacts the upper end of the drive shaft 55 and prevents downward movement of the table 11 beyond a certain point.

Needless to say, it is not essential that the transport table 11 be splined directly to the drive shaft 55, but the same effect may be achieved by different constructions, for example comprising a tube fixedly attached to the table 11 and splined to the shaft 55.

Figure 8:
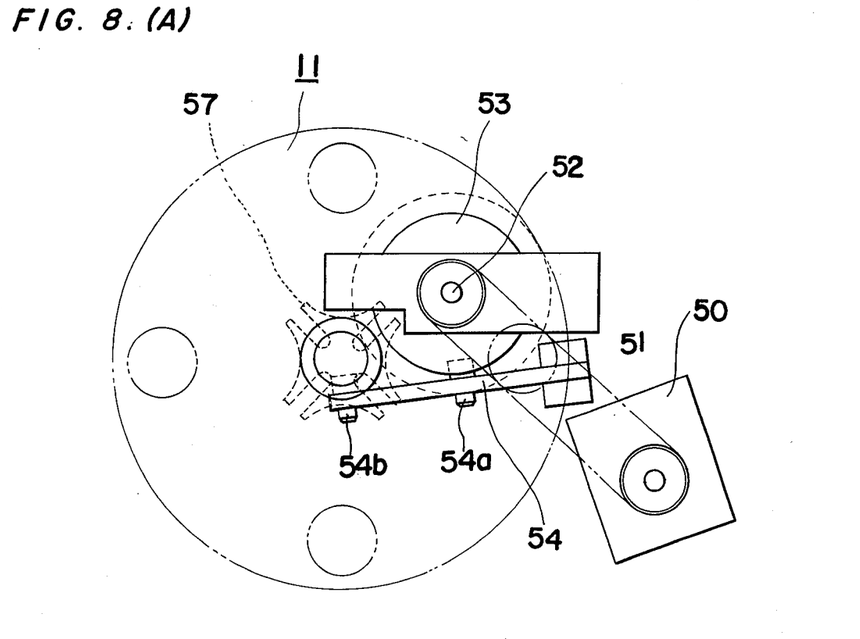

On the lower end portion of the drive shaft 55 there is mounted a Geneva gear 57 drivable by a Geneva driver 56, which is fixedly mounted on a shaft 52 which is rotatable by drive supplied thereto by a pulse motor 50 acting through a drive transmission belt 51. On the shaft 52 there is also mounted a horizontally aligned cam plate 53 having lower surface portions which contact and drive a pivot shaft 54 a which constitutes the pivotal center of a lever 54 fixedly mounted thereon. To one end of the lever 54 there is rotatably attached a stud 54b which extends into and is freely slidable in a vertically aligned slot 55b formed in a sleeve 55a which is provided around but does not contact the transport table drive shaft 55, and is slidably mounted on vertically aligned guide elements, not shown, which are fixedly mounted on a fixed portion of the interior of the working table unit 27b. By the action of the stud 54b contacting the lower end of the slot 55b the sleeve 55a may be moved to a lower position in which the upper end of the sleeve 55a is out of contact with the lower plate 11c attached to the transport table 11, this being the configuration shown in FIG. 8 (B); and the table 11 moves downwards under its own weight until transport table upper plate 11b comes into contact with the top of the drive shaft 55. In this case the table 11 is level with the lowermost portions 36b of the jigs 5 through 8. The lever 54 is pivoted to thus bring the stud 54b into contact with the lower end of the slot 55b of the sleeve 55a by the action of the cam 53 lower surface contacting the pivot shaft 54a. When the cam 53 does not contact the pivot shaft 54a, the lever 54 is pivoted by a tensile element 54c to a position in which the stud 54b presses against the upper end of the slot 55b, whereby the sleeve 55a is moved upwards and, pressing against the transport table lower plate 11c, moves the transport table 11 upwards, whereby the transport table holes 11a move to around the intermediate portions 36b of the jigs 5 through 8, and the transport table 11 presses against the jig wall portions 36c (see FIG. 6) lifts the jigs 5 through 8 to a height at which they are clear of steel balls 42a through 42f at the loading station I and wire-bonding station III.

The transport table 11 is normally stationary at the lower position, but when motor 50 is actuated, by depression of push-button 28, the table 11 is first raised, then rotated 90° while carrying the jigs 5 through 8, then lowered, actuation of the motor 50 being terminated until push-button 28 is again actuated. When the table 11 is lowered, the jigs at the first intermediate position II and second intermediate position IV are not contacted by other portions of the equipment and remain held by the table 11, whereas the jigs at the loading station I and the wire-bonding station III are lowered onto the mounting support 9 and positioning table 10 and, when the transport table 11 reaches the lower position are not contacted by the table 11. At this time, as is apparent from FIG. 6, the jig at the wire-bonding station III may be moved in any direction over a distance equal to half the difference between the diameter a of a transport table hole 11a and the diameter b of the lowermost portion of the jig main body 36. The top of the sleeve 55 is made suitably smooth in order to avoid hindrance of rotation of the transport table 11.

During transport by the transport table 11 even if a jig is moved slightly out of the initial alignment thereof on the mounting support 9, the piston 38 holds the jig head 31 firmly in the set positional relationship to the jig main body 36, and during lowering of the jig onto the positioning table 10 the cavities 43a, 43b and 43c fit smoothly over tha balls 42d, 42e and 42f on the positioning table 10, whereby the jig, and hence the module carried thereby are guided to and held in their initial alignment.

Referring now to FIGS. 9A and 9B, the positioning table 10 comprises a rotatable jig support 58 and a displacement table 67 which carries the jig support 58 and is independently moveable in linear motion in a direction referred to below as the x direction, and another displacement table 69 which carries the x displacement table 67, is slidably mounted on a fixed base 80 and may be moved in a y direction which is normal to the x direction.

The rotatable jig support 58 is supported by and may rotate in bearings 64 provided on a rigid stand 65 fixedly mounted on the x displacement table 67, and is connected to and rotatable synchronously with a large gear 63 which is driven by a small gear 62 mounted on the output shaft of a pulse motor 61 also mounted on the x displacement table 67, the support 58, motor 61 and associated gears 62 and 63 thus being constrained to move together with the x displacement table 67, but the support 58 being rotatable independently of the x displacement table 69. The angular position of the pulse motor 61 is detected by a detector 83.

In FIGS. 9A and 9B and 10A and 10B, similarly to the abovedescribed main body portion 45 of the fixed mounting support 9, the rotatable jig support 58 has affixed to the upper surface thereof a cover plate 44b in which are fixedly seated the abovementioned balls 42d, 42e and 42f, and has a vertically aligned central hollow cylinder passage 66 in which is slidably mounted a piston 59 defining a central through-passage 47' which communicates with the interior of the cylinder passage 66. The head of the piston 59 has peripheral portions which fit smoothly on the bottom of a jig lowered onto the support 58 by the transport table 11 and may also contact the jig through a contact plate 60.

Figure 9:
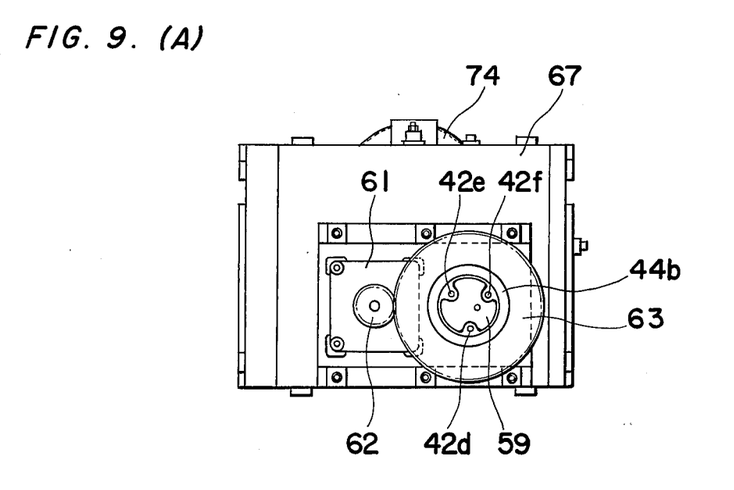
Figure 10:
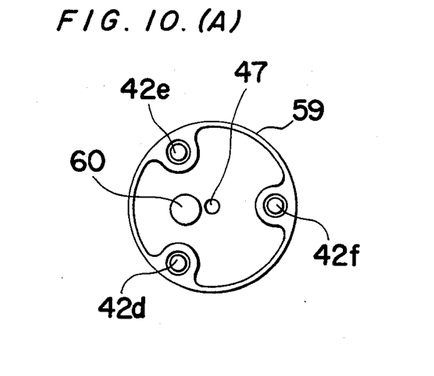

In FIG. 9 (B), the lower end of the cylinder passage 66 communicates with an air passage 65a which is formed in the fixed stand 65 and communicates with a second vacuum-producing unit, not shown. The second vacuum-producing unit is actuated either automatically when action of the transport table motor 50 is terminated, or in response actuation of the wire-bonder unit control switch 29, and when actuated causes the piston 37 (FIG. 6) of a jig on the support 58 to move downwards and hold the jig firmly on the support 58. When this is done the piston 37 of course no longer presses against the collar 31b of the jig head 31. However, as noted above, the collar 31b is in frictional contact with the jig main body 36 and top plate 34 and there is therefore no risk of displacement of the jig head 31 relative to the jig main body portion 36 during displacement of the positioning table 10, which is only of the order of 100 to 200 microns to bring successive terminals of the jig on the positioning table 10 into line with the tip of the wire-bonder 13, while on the other hand, since the jigs 5 through 8 are longer than they are broad and also since a jig is supported by the bottom, smallest diameter portion thereof when on the positioning table 10, it is preferable to ensure that this portion is securely held to the table 10.

To ensure effective action of the vacuum produced by the first and second vacuum-producing units it is sufficient that peripheral portions of the heads of the cylinders 46 and 59 of the mounting support 9 and rotary support 58 be in smooth contact with the bottom plates 40 of jigs. It is of course also possible for these cylinder heads to have peripheral upward extensions which fit into grooves formed in bottom plates 40, in which case there is the further advantage that positioning of a jig on the mounting support 9 or rotatable support 58 is assisted.

To ensure exact coincidence of alignment holes which are formed in the bottom plates 40 of the jigs 5 through 8 and on the cover plates 44 and 44' of the mounting support 9 and rotary support 58 and into which the balls 42a, 42b, 42c, 42d, 42e, or 42f are fitted, a single template is suitably employed in the formation of all these holes.

Figure 11:
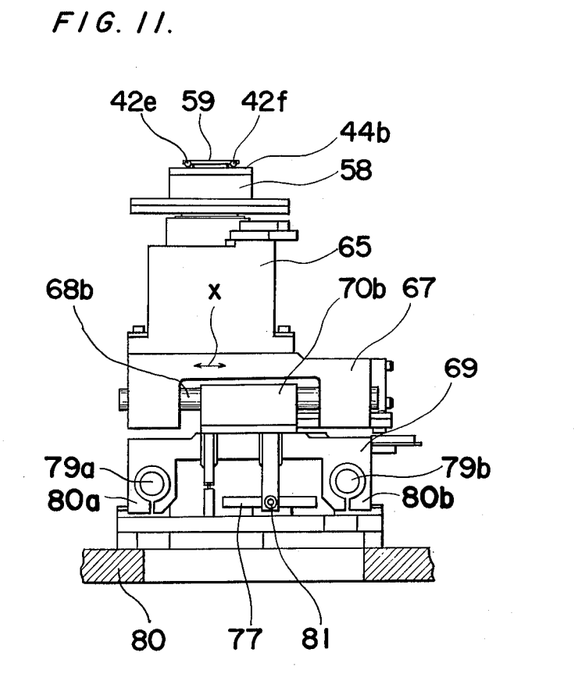
FIG. 11 is a side view of the positioning means of FIG. 9B.

Referring to FIG. 9 (B) and to FIG. 11, shafts 68a and 68b which are fixedly attached to opposite side portions of the lower surface of the x displacement table 67 are slidable in bearings 70a and 70b which are fixedly mounted on the upper surface of the y displacement table 69.

Figure 12:
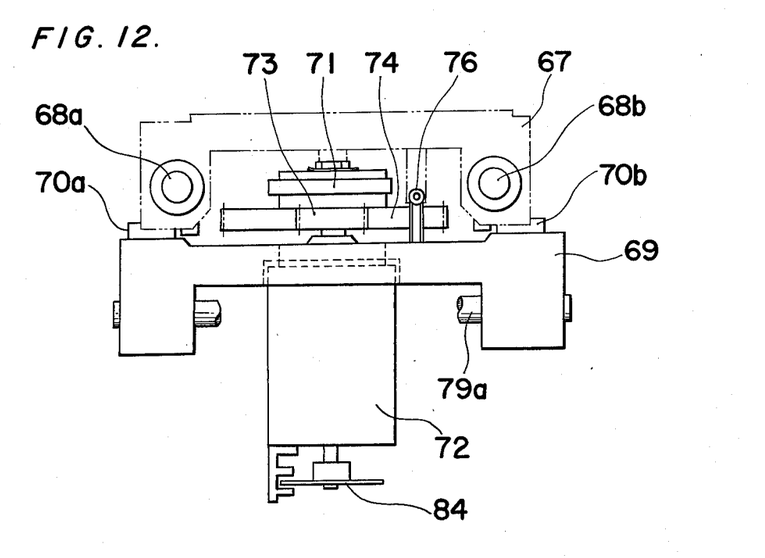
FIG. 12 is a schematic side view showing details of drive means in the positioning means of FIGS. 9A and 9B.
Figure 13:
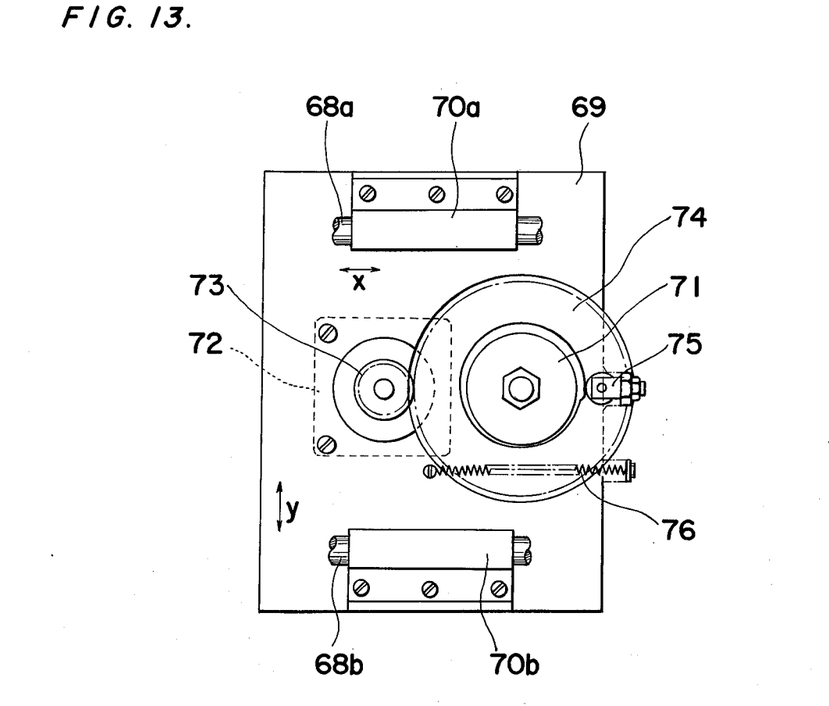
FIG. 13 is a plan view of drive means in the positioning means of FIGS. 9A and 9B.

In FIGS. 9 (B), 12, and 13, drive from a pulse motor 72 which is mounted on and carried by the y displacement table 69 and has associated therewith an angular position detector 84, is transmitted through gears 73 and 74 to a horizontally disposed linear cam 71. A cam roller 75 rotatably supported in a mount fixedly attached to the lower surface of the x displacement table 67 is urged into contact with the periphery of the linear cam 71 by a compression spring means 76 having one end connected to the cam roller mount or to a suitable portion of the x displacment table 67 and the opposite end connected to the y displacement table 69. Thus, as seen in FIG. 13 and x displacement table 67 is moved to the left as far as is permitted by the cam 71 contacted by the roller 75, and the position of the x displacement table 67 on the y displacement table 69 may be changed by rotation of the linear cam 71.

In FIGS. 9 (B), 11 and 12 the y displacement table 69 has fixedly attached to opposite sides of the lower surface thereof shafts 79a and 79b which are respectively slidable in bearings 80a and 80b fixedly attached to the base 80. The y displacement table 69 is moveable requisite distances in the y direction by drive supplied from a pulse motor 78 via suitable gears to a linear cam 81 with which a cam roller attached to the y displacement table 69 is maintained in contact by spring means such as provided in association with the x displacement table 67. The angular position of the pulse motor 78 is detected by a detector 85.

The detectors 83, 84, and 85 for the pulse motors 61, 72, and 78 supply feedback to the numeric control unit 19 which acts to drive the motors 61, 72, and 78, and is initially programmed to cause requisite rotation of the rotary support 58 and movement of the x displacement table 67 and y displacement table 69 to bring successive terminals of a module carried by a jig mounted on the support 58 into position for connection thereto of wires by the wire-bonder unit 26, which also is actuated by the control unit 19, as noted above. Employment of linear cams for driving the different elements of the positioning table 10 has the advantages that compared with conventional screw drive transmission means a more compact construction is possible and there is smaller risk of error in the drive transmission system, since rotary movement is converted directly to requisite displacement of an element of the positioning table 10, and that, since the cam pressure angle is small, requisite short displacement of a module which is at most 5mm in a module having dimensions $120\mu \times 120\mu$ for example, may be effected smoothly.

In addition, there is also the advantage that use of the equipment of the invention entails much less fatigue of an operator, since loading of a module onto a jig at the loading station I may be effected while observing a comparatively large television screen, and there is no need for constant observation through a microscope to be made while wiring of a module at the wire-bonding station III is proceeding, it being simply necessary to make occasional observation through the microscope 23 to determine when wiring is completed.

Figure 14:
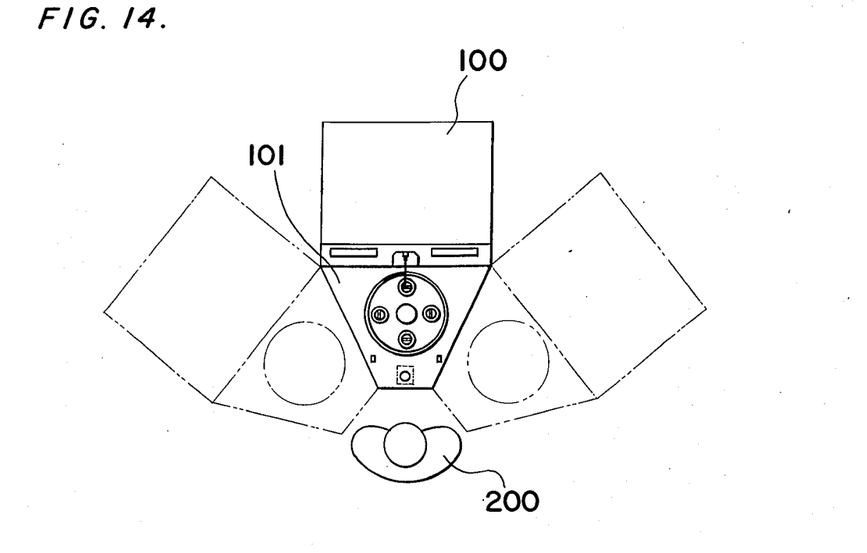
FIG. 14 is a plan view showing a layout permitting an operator to control a plurality of units of wire bonding equipment according to the invention.

The invention thus permits maintenance of quality and steady production of wired modules, in a simply controlled and supervised process. As noted above, time reqirements for module unloading and loading and wiring effected at the wire-bonding station are such that an operator may control three units of wire-bonding equipment, whereby staff requirements for wire-bonding work are reduced. In such a case, a suitable arrangement is that shown in FIG. 14 in which three wire-bonding units 100 are disposed fan-fashion about and at a equal distance from a seat 101, for example, from which an operator 200 may control such of the three units 101 by turning to each unit in turn indicated by the chain-dot line in the drawing.

Needless to say, although offering particular advantages when employed in wiring of microelectronic modules, the equipment of the invention may be easily modified to permit use thereof as a means for effecting wiring or similar connection of larger elements. This and other modifications being possible and contemplated, there is not intention of limiting the invention to the exact details shown and described above, but the scope of the invention should be determined from the following claims.

What is claimed is:

1. In equipment for bonding of wires to selected portions of successive elements, wire-bonding equipment comprising:
   jig alignment and mounting support means fixedly mounted on said equipment and having an upper surface portion with alignment elements thereon for mounting of a jig on said support means in a required alignment with respect to said equipment;
   at least one jig having a main body portion with a lowr surface portion having alignment elements corresponding to and removably engagable with said alignment elements on said mounting support means, a head portion having an upper surface portion on which an element to be wired can be fixedly held, said head portion being movable with respect to said main body portion only upon application of external pressure to said head portion, normally unactuated holding means normally holding said head portion stationary with respect to said main body portion and actuable for releasing said head portion for permitting movement thereof only upon application of said external pressure;

positioning table means spaced from said jig alignment and mounting support means and having an upper surface portion with further alignment elements identical in size and configuration to said firstmentioned alignment elements for mounting thereon of a jig carrying an element to be wired in same said alignment with respect to said equipment as when said jig is on said jig alignment and mounting support means, said positioning table means being movable in requisite directions to bring successive portions of an element mounted thereon to a wire supply point;

a wire-bonder unit adjacent said positioning table means and repeatedly actuable for supplying wire to said wire support point and bonding said wire to a portion of an element to be wired which is brought to said wire supply point;

externally actuable control means coupled to said wire-bonder unit and said positioning table means for effecting synchronized actuation of said wire-bonder unit and said positioning table means; and externally actuable transport means operatively associated with said mounting support means and said positioning table means for removing said jig from and placing said jig onto said mounting support means and said positioning table means and for transporting said jig between said support means and said positioning means while maintaining said jig generally in said alignment with respect to said equipment.

2. Wire-bonding equipment as claimed in claim 1, wherein said alignment elements on said mounting support means and on said positioning table means are balls of solid material and of uniform size, and mounting support means and said positioning table means having holes in the upper surface portions thereof in which said balls are positioned with said balls projecting above said upper surface portions, and said alignment elements in said jig are constituted by concave portions in the lower surface portion of said jig and fittable over said balls.

3. Wire-bonding equipment as claimed in claim 1, wherein said holding means comprises a cover plate means fixed to and positioned above said main body portion of said jig and contacting the edge portions of said jig, a generally central open portion in said main body portion, a piston slidable in said open portion, a first normally unactuated vacuum-producing means having an externally actuable control switch means and connected to said open portion, spring means engaged with said piston and normally urging said piston against said head portion normally being fixedly held against said cover plate means, said piston being moved counter to the force of said spring means and out of pressure contact with said head portion upon actuation of said first vacuum-producing means for releasing said head portion.

4. Wire-bonding equipment as claimed in claim 3, wherein said first vacuum-producing means control switch means comprises a light source and a photodetector element normally receiving light emitted from said light source and so positioned that a hand of a person placing an element to be wired on said jig on said mounting support means prevents impingement on said photodetector element of light emitted by said light source, said first vacuum-producing means being unactuated when said light impinges on said photodetector element.

5. Wire-bonding equipment as claimed in claim 3, wherein said piston has a portion which exerts downward pressure for urging said main body portion of said jig into firm contact with said mounting support means upon actuation of said first vacuum-producing means.

6. Wire-bonding equipment as claimed in claim 5, which further comprises a second vacuum-producing means actuable simultaneously with said wire-bonder unit, and wherein said positioning table means has a passage means therein for providing communication between said second vacuum-producing means and said central opening formed in said jig.

7. Wire-bonding equipment as claimed in claim 3, wherein said mounting support means has a generally central opening for providing communication between said first vacuum-producing means and said central opening in said main body portion of said jig.

8. Wire-bonding equipment as claimed in claim 1, wherein said positioning table means comprises independently actuable rotary means for rotating said upper surface portion in the plane thereof, first linear displacement means for moving said upper surface means in a line in said plane, and second linear displacement means for moving said upper surface means in a line normal to the line of movement of said first linear dislacement means.

9. Wire-bonding equipment as claimed in claim 8, wherin said rotary means is mounted on said first linear displacement means, said first linear displacement means is slidably supported on said second linear displacement means, and said equipment further comprises a base on which said second linear displacmenet means is slidably mounted.

10. Wire-bonding equipment as claimed in claim 8, wherein said rotary means, said first linear displacement means, and said second linear displacement means each have a linear cam thereon and a pulse motor means driving the linear cam and having associated therewith an angular position detection means for supplying feedback to said control means indicative of the amount of movement imparted by the corresponding said linear cam.

11. Wire-bonding equipment as claimed in claim 1, in which there is a plurality of said jigs, and wherein said transport means is constituted by a rotary transport table means for simultaneously carrying all said jigs along a circular path, and said mounting support means and said positioning table means are located at different points around the periphery of said circular path over which said jigs are transported by said transport table means, said transport table means carrying said jigs over only a portion of said circular path upon each actuation of said transport table means, whereby successive said jigs are brought successively to said mounting support means and said positioning table means.

12. In equipment for bonding of wires to selected portions of successive elements, wire-bonding equipment comprising:

jig alignment and mounting support means fixedly mounted on said equipment and having an upper surface portion with alignment elements thereon for mounting of a jig on said support means in a required alignment with respect to said equipment;

at least one jig having a main body portion with a lower surface portion having alignment elements corresponding to and removably engagable with said alignment elements on said mounting support means, a head portion having an upper surface portion on which an element to be wired can be fixedly held, said head portion being movable with respect to said main body portion only upon application of external pressure to said head portion, normally unactuated holding means normally holding said head portion stationary with respect to said main body portion and actuable for releasing said head portion for permitting movement thereof only upon appliction of said external pressure;

a television camera positioned above said jig alignment and mounting support means for photographing the upper surface portion of a jig head portion at said mounting support means;

a television screen coupled to said camera for displaying images photographed by said television camera and having marked thereon alignment marks with indicate when a module on said jig on said mounting support means is in a requisite alignment;

positioning table means spaced from said jig alignment and mounting support means and having an upper surface portion with further alignment elements indentical in size and configuration to said first mentioned alignment elements for mounting thereon of a jig carrying an element to be wired in same said alignment with respect to said equipment as when said jig is on said jig alignment and mounting support means, said positioning table means being movable in requisite directions to bring successive portions of an element mounted thereon to a wire supply point;

a wire-bonder unit adjacent said positioning table means and repeatedly actuable for supplying wire to said wire support point and bonding said wire to a portion of an element to be wired which is brought to said wire supply point;

microscope means adjacent said positioning table means for observation of a module on said positioning table means whereby it may be known when wiring of a module is completed;

externally actuable control means coupled to said wire-bonder unit and said positioning table means for effecting synchronized actuation of said wire-bonder unit and said positioning table means; and externally actuable transport means operatively associated with said mounting support means and said positioning table means for removing said jig from and placing said jig onto said mounting support means and said positioning table means and for transporting said jig between said support means and said positioning means while maintaning said jig generally in said alignment with respect to said equipment.

13. Wire-bonding equipment as claimed in claim 12, wherein said wire-bonder unit is an ultrasonic wire-bonder unit.

14. Wire-bonding equipment as claimed in claim 12, wherein said wire-bonder unit comprises means for supplying fine aluminum wire.

* * * * *